United States Patent [19]

Schneider et al.

[11] 3,742,261

[45] June 26, 1973

[54] SOLID STATE VACUUM TUBE REPLACEMENT

[75] Inventors: Emery J. Schneider, Sunnyvale; Bruce G. Burman, Cupertino, both of Calif.

[73] Assignee: Teledyne, Inc., Mountain View, Calif.

[22] Filed: Oct. 6, 1971

[21] Appl. No.: 187,006

[52] U.S. Cl. .................... 307/304, 330/35
[51] Int. Cl. .................... H03f 3/16
[58] Field of Search .................... 307/304, 315; 330/35; 315/52

[56] References Cited

UNITED STATES PATENTS

| | | | |
|---|---|---|---|
| 2,618,690 | 11/1952 | Stuetzer | 307/304 X |
| 3,509,367 | 4/1970 | Orsen | 307/315 X |
| 3,510,806 | 5/1970 | Gremillet | 307/304 X |
| 3,531,654 | 9/1970 | Eby | 315/52 X |

OTHER PUBLICATIONS

Amelco Semiconductor No. 2, June 1962, "Field Effect Transistors."

*Primary Examiner*—John S. Heyman
*Attorney*—Flehr, Hohbach, Test, Albritton & Herbert

[57] ABSTRACT

A solid state assembly and base which can be plugged as a replacement directly into a vacuum tube socket in a vacuum tube circuit and provide the same characteristics as the vacuum tube which it replaces.

5 Claims, 9 Drawing Figures

SOLID STATE VACUUM TUBE REPLACEMENT

BACKGROUND OF THE INVENTION

The invention relates generally to a solid state or semiconductor device assembly and more particularly to a solid state assembly which can be used as a replacement for vacuum tubes in vacuum tube circuits.

The conversion of equipment from vacuum tube to solid state circuitry is normally one of replacing the entire circuit with a semiconductor solid state device and circuit.

The pentode and triode vacuum tube has been widely used in electronic industries and there are hundreds of millions of these in use today operating in equipment that functions according to the design intent. There are, however, major disadvantages to vacuum tubes compared to transistor or solid state devices such as power requirements for the emission source, its relatively short life, and the adverse effects of heat generated in the vacuum tube upon other circuit components. Equipment using transistors has eliminated some of these problems. However, in order to introduce solid state devices, there is a large capital expenditure for the replacement of existing circuits in equipment.

In order to satisfactorily replace tubes in vacuum tube circuits, the semiconductor replacement must meet all of the essential d.c. and a.c. parameters of the tube in the circuits with which it is used. It must have the same overall characteristics such as phase shift, gain characteristics, frequency response and others whereby to effectively work as a replacement.

OBJECTS AND SUMMARY OF THE INVENTION

It is a general object of the present invention to provide a solid state vacuum tube replacement which has a high transconductance, $g_m$, high voltage breakdown characteristics, low feedback capacitance, high output impedance, no warm-up, no microphonics, transistor type reliability, low noise, low distortion and stability.

The foregoing objects are achieved by a solid state device which comprises a base having a plurality of pins adapted to fit into the vacuum tube socket as a replacement for the vacuum tube and means for mounting on said socket a solid state circuit including a first high gain, low voltage field effect transistor having source, drain and gate electrodes, a second high voltage, moderate gain field effect transistor having source, drain and gate electrodes with said transistors connected with the source of said first transistor to the cathode pin of said base and to the gate of said second transistor, the gate terminal of said first transistor being connected to the grid terminal of said tube base, the drain of said first transistor to the source of the second transistor and the drain of the second transistor connected to the plate pin of the tube.

DESCRIPTION OF THE PREFERRED EMBODIMENT

Figure 1:
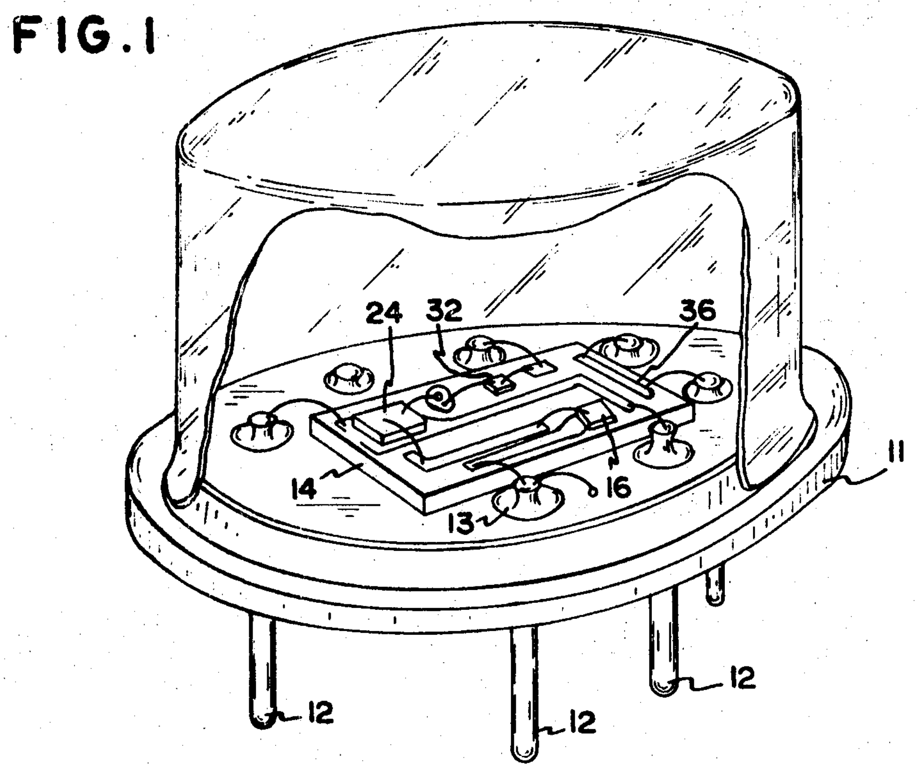
FIG. 1 is a perspective view of a solid state transistor replacement partially broken away to show the semiconductor devices.

Referring to FIG. 1, the vacuum tube replacement includes a base 11 with a plurality of pins 12 spaced and arranged in a conventional vacuum tube spacing whereby they can be received by a conventional vacuum tube socket. The pins extend through a lead-through formed in the base. The lead-through comprises a ceramic or glass window 13 which provides a hermetic seal between the base 11 and each of the pins 12.

A ceramic wafer 14 is mounted on the base 11 and serves to support the conductive thin film circuit and the semiconductor devices forming the solid state vacuum tube replacement.

Figure 2:
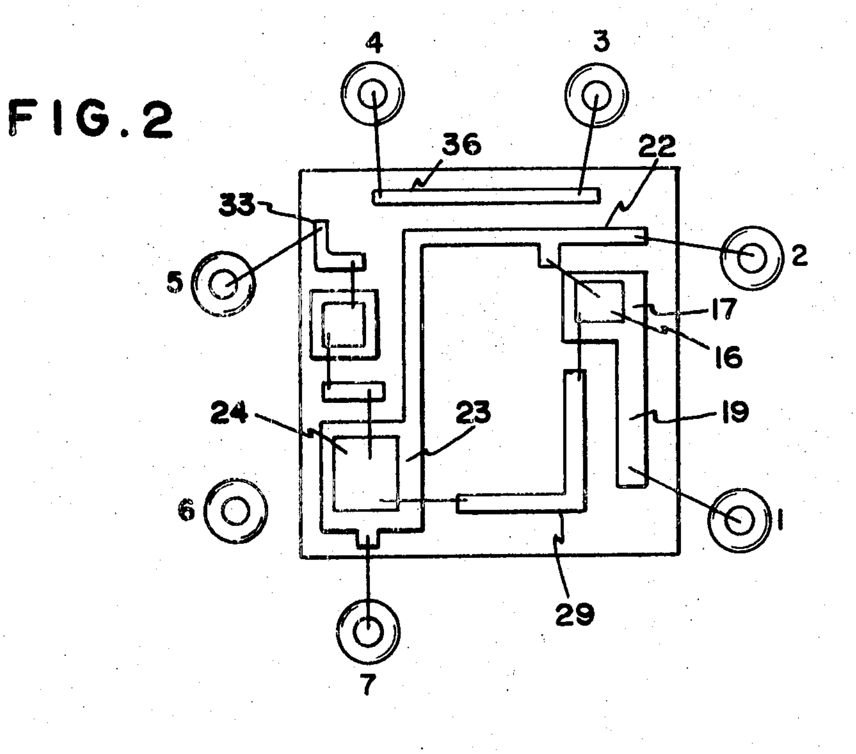
FIG. 2 is a plan view of the semiconductor device assembly shown in FIG. 1.
Figure 5:
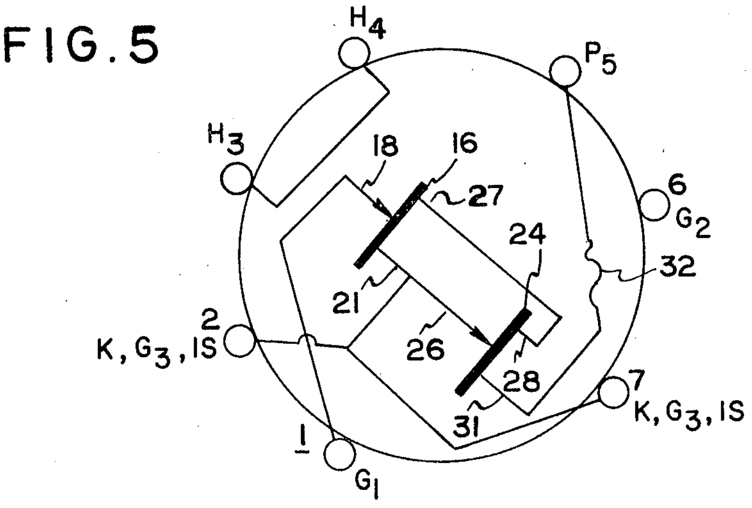
FIG. 5 is a schematic circuit diagram showing the connection of the semiconductor devices to the base pins.
Figure 6:
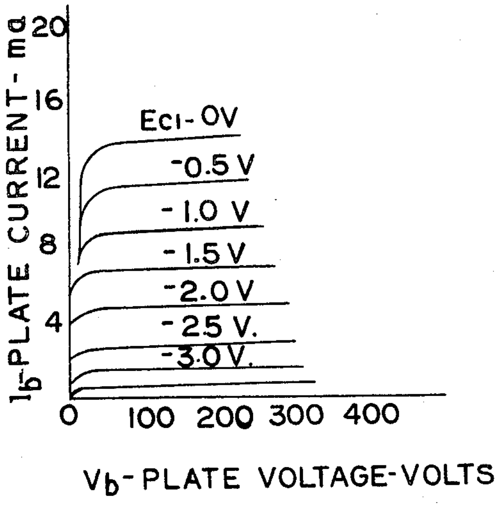
FIGS. 6 and 7 show the average plate characteristics of a replacement constructed in accordance with the invention.
Figure 7:
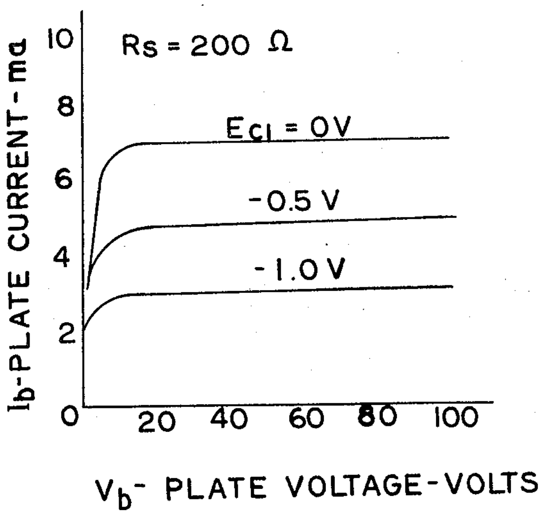
Figure 8:
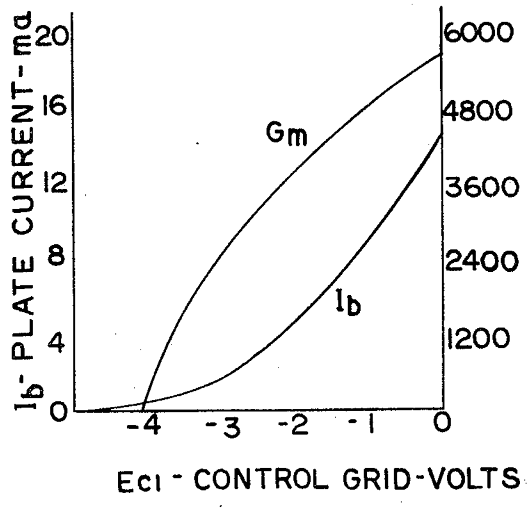
FIG. 8 shows the plate current and transconductance as a function of control grid voltage of a replacement constructed in accordance with the invention.
Figure 9:
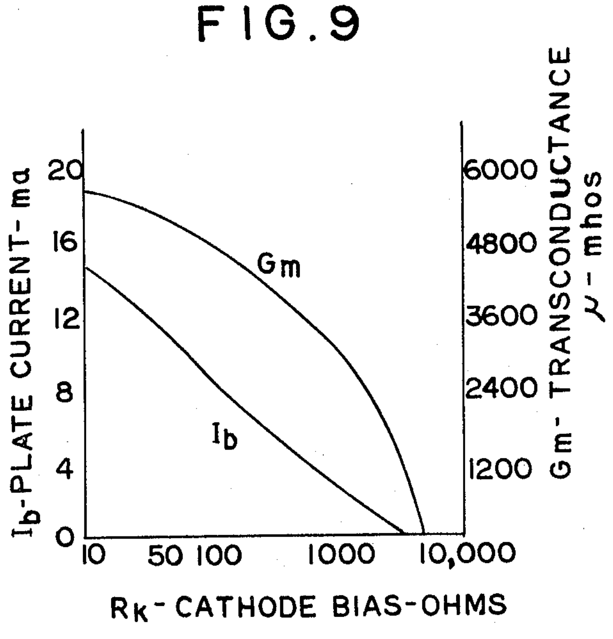
FIG. 9 shows the plate current and transconductance as a function of the cathode bias resistance of a replacement constructed in accordance with the invention.

Referring now to FIGS. 1, 2 and 5, the solid state circuit comprises a first high gain, low voltage field effect transistor 16 mounted on a conductive pad 17 which connects to the gate terminal 18. The pad includes a strip 19 connecting to the grid pin, pin 1 in the example, of the vacuum tube base. The source electrode 21 is connected to strip 22 which is connected to the cathode pin, pin 2 in the example, of the vacuum tube base. The strip 22 includes a pad 23 on which is mounted a second high voltage, moderate gain transistor 24. The source 21 of transistor 16 is connected to the gate 26 of the transistor 24 by the strip 22 and pad 23. The drain electrode 27 of transistor 16 is connected to the source electrode 28 of the transistor 24 by conductive strip 29. The drain electrode 31 of transistor 24 is connected via a fuse 32 to conductive member 33 and to the plate pin, pin 5 in the example, of the vacuum tube socket. The fuse is provided to protect the semiconductor devices. In certain applications it may be eliminated. If desired, the pins 2 and 7 may be connected together and grounded to the tube base 11. Pins 3 and 4 may be left unconnected or they may be provided with a resistive connection such as shown at 36 to simulate the vacuum tube heater when connected in a vacuum tube circuit including series heaters.

Figure 3:
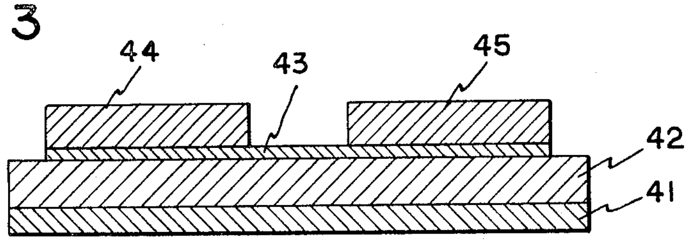
FIG. 3 is a side elevational view in section of the fuse employed in the semiconductor device circuit.
Figure 4:
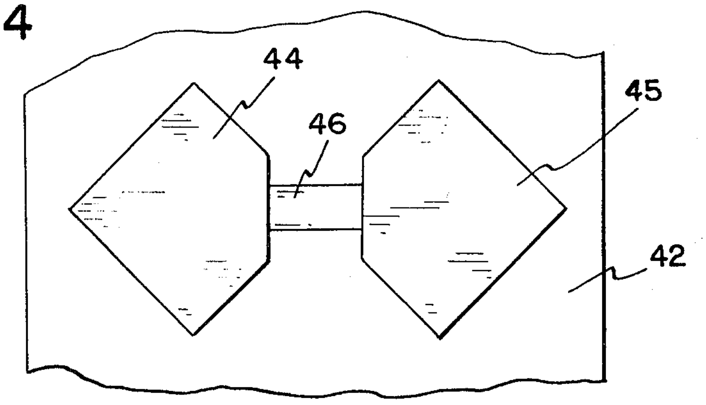
FIG. 4 is a plan view of the fuse shown in FIG. 3.

The fuse may comprise a tantalum fuse constructed as shown in FIGS. 3 and 4. The fuse comprises a substrate 41 provided with a silicon dioxide layer 42. A shaped tantalum layer 43 is evaporated on the silicon dioxide and spaced aluminum terminals 44 and 45 are applied to the tantalum. The strip 46 extending between the aluminum contacts 44 and 45 can be selected with a width and thickness to provide the desired fusing current.

In the circuit shown, the device gain and input capacitance are controlled primarily by the device 16 while the breakdown voltage of the circuit is determined by the second device 24. When the vacuum tube replacement is intended to replace a 6AK5 pentode, the devices 16 and 24 are selected as follows: Device 16 is selected to have a saturation current at 15 volts of between 15 and 24 milliamps; maximum pinchoff voltage of less than 7 volts with a source to drain current of 10 microamps at 10 volts applied between the drain and source; and breakdown voltages greater than 25 volts with the gate source and gate drain shorted to one another. Device 24 is selected to have a saturation current at 20 volts between 20 and 50 milliamps; a pinchoff voltage less than 20 volts with source to drain current of 100 microamps and 5 volts applied between the drain and source; breakdown voltage, drain to gate at 10 microamps of greater than 275 volts with the source open; and a breakdown voltage, source to gate with drain open at 10 milliamps greater than 50 volts. With the foregoing characteristics, a device constructed exhibited characteristics as shown in FIGS. 6, 7, 8 and 9. The general characteristics were as follows:

| | |
|---|---|
| Heater Voltage | not connected |
| Heater Current | not connected |
| Grid No.1 to Plate Cap | 0.02 $\mu\mu$f |
| Grid No.1 to Cathode Cap | 8.0 $\mu\mu$ f |
| Grid No.2 & Grid No.3 Cap | not connected |

Maximum ratings when employed in a Class A Amplifier:

| | |
|---|---|
| Plate Voltage | 180 volts |
| Grid — No.2 (screen-grid) voltage | not connected |
| Grid — No.1 (control-grid) voltage, Positive-bias value | 0 volts |
| Plate Dissipation | 1.7 watts |
| Screen Grid Dissipation | not connected |
| Cathode Current | not connected |

Typical operating conditions and characteristics were as follows:

| | Symbol | Min | Typ. | Max | Units |
|---|---|---|---|---|---|
| Plate Supply Voltage | $E_b$ | | 120 | | volts |
| Grid No.2 Supply Voltage | $E_{C2}$ | | N/C | | |
| Cathode Pins Resistor | $R_K$ | | 200 | | ohms |
| Plate Resistance | $\gamma_p$ | 0.5 | 5 | | megohms |
| Transconductance | $g_m$ | 3500 | 4500 | 6500 | $\mu$ mhos |
| Grid No.1 Voltage for plate current of 10 $\mu$ A | $E_{C1}$ | | −5 | −8.5 | volts |
| Plate Current | $I_b$ | 4 | 7 | 10 | mA |
| Grid No.2 Current | $I_{C2}$ | | N/C | | |
| Amplification Factor | | | 22500 | | |
| Useful Frequency Limit | $f_T$ | | 600 | | megahertz |
| Grid Current | $I_{C1}$ | | 0.1 | 100 | nanoamps |

From the foregoing, it will be seen that by selecting the devices 16 and 24 as indicated, a vacuum tube replacement for a 6AK5 pentode and similar family replacement types is provided having substantially the same a.c. and d.c. characteristics and operating parameters.

For pentode replacements, generally the devices 16 and 24 are selected to have characteristics falling within the following ranges: Device 16 is selected to have a saturation current at 15 volts of between 1 and 60 milliamps; maximum pinchoff voltage of less than 20 volts with a source to drain current of 10 microamps at 10 volts applied between the drain and source; and breakdown voltages greater than 25 volts with the gate source and gate drain shorted to one another. Device 24 is selected to have a saturation current at 20 volts between 10 and 150 milliamps; a pinchoff voltage less than 20 volts with a source to drain current of 10 microamps at 5 volts applied between the drain and source; breakdown voltage, drain to gate, at 10 microamps of greater than 200 volts with the source open; and breakdown voltage, source to gate with drain open at 10 microamps of greater than 50 volts.

It will also be observed from the characteristics shown that the semiconductor assembly including three output terminals can be substituted for certain triode tubes having operating current characteristics similar to those of pentodes.

In conclusion then, there is provided a vacuum tube replacement including a plurality of solid state devices. The replacement has the advantage that it may be inserted directly in a conventional vacuum tube circuit with the circuit operating in its conventional manner without the requirement of replacing the circuitry associated with the socket.

We claim:

1. A vacuum tube replacement comprising a base having a plurality of pins adapted to fit in a vacuum tube socket as a replacement for a vacuum tube, a first high gain, low voltage field effect transistor having source, drain and gate electrodes, a second high voltage, moderate gain field effect transistor having source, drain and gate electrodes, said transistors connected with the source of the first to the cathode pin of said base and to the gate terminal of said second transistor, the gate terminal of said first transistor connected to the grid pin of said base, the drain terminal of said first transistor connected to the source terminal of the second and the drain terminal of the second connected to the plate pin of said base.

2. A vacuum tube replacement as in claim 1 wherein said first transistor has a saturation current at 15 volts of between 15 and 24 milliamps; maximum pinchoff voltage of less than 7 volts with a source to drain current of 10 microamps at 10 volts applied between the drain and source; and breakdown voltages greater than 25 volts with the gate source and gate drain shorted to one another, and said second transistor has a saturation current at 20 volts between 20 and 50 milliamps; a pinchoff voltage less than 20 volts with source to drain current of 100 microamps and 5 volts applied between the drain and source; breakdown voltage, drain to gate at 10 microamps of greater than 275 volts with the source open; and a breakdown voltage, source to gate with drain open at 10 milliamps greater than 50 volts.

3. A vacuum tube replacement as in claim 1 wherein said first transistor has a saturation current at 15 volts of between 1 and 60 milliamps; maximum pinchoff voltage of less than 20 volts with a source to drain current of 10 microamps at 10 volts applied between the drain and source; and breakdown voltages greater than 25 volts with the gate source and gate drain shorted to one another, and said second transistor has a saturation current at 20 volts between 10 and 150 milliamps; a pinchoff voltage less than 20 volts with a source to drain current of 10 microamps at 5 volts applied between the drain and source; breakdown voltage, drain to gate, at 10 microamps of greater than 200 volts with the source open; and breakdown voltage, source to gate with drain open at 10 microamps of greater than 50 volts.

4. A vacuum tube replacement as in claim 1 including a fuse connected between the drain terminal of the second transistor and the plate pin of said base.

5. A vacuum tube replacement as in claim 1 wherein said first and second transistors are mounted on a ceramic wafer carried on said base.

* * * * *

PO-1050
(5/69)

UNITED STATES PATENT OFFICE
CERTIFICATE OF CORRECTION

Patent No. 3,742,261 Dated June 26, 1973

Inventor(s) EMERY J. SCHNEIDER AND BRUCE G. BURMAN

It is certified that error appears in the above-identified patent and that said Letters Patent are hereby corrected as shown below:

Column 3, line 7, after "volts" add --from source to gate--

Column 3, line 8, delete "gate" first and second occurrences.

Column 3, line 63, after "volts" add --from source to gate-- and delete "gate" the last word in the line.

Column 3, line 64, delete "gate"

Claim 2, line 7, after "volts" add --from source to gate-- and delete "gate" appearing before "source" and before "drain"

Claim 3, line 7, after "volts" add --from source to gate-- and delete "gate" appearing before "source" and before "drain".

Signed and sealed this 20th day of August 1974.

(SEAL)
Attest:

McCOY M. GIBSON, JR.
Attesting Officer

C. MARSHALL DANN
Commissioner of Patents